United States Patent [19]
Collins et al.

[11] Patent Number: 5,916,689
[45] Date of Patent: *Jun. 29, 1999

[54] ELECTROSTATIC CHUCK WITH AN IMPREGNATED, POROUS LAYER THAT EXHIBITS THE JOHNSON-RAHBECK EFFECT

[75] Inventors: Kenneth S. Collins, San Jose; Joshua Chin-Wing Tsui, Santa Clara; Douglas Buchberger, Tracy, all of Calif.

[73] Assignee: Applied Materials, Inc., Santa Clara, Calif.

[ * ] Notice: This patent is subject to a terminal disclaimer.

[21] Appl. No.: 08/583,975

[22] Filed: Jan. 11, 1996

Related U.S. Application Data

[63] Continuation-in-part of application No. 08/372,177, Jan. 12, 1995, Pat. No. 5,792,562.

[51] Int. Cl.⁶ ........................................ B32B 15/08
[52] U.S. Cl. .......................... 428/463; 428/469; 428/472; 428/306.6; 428/307.3; 361/230; 361/234; 279/128; 268/8; 268/13
[58] Field of Search ..................... 428/469, 458, 428/472, 463, 306.6, 307.3; 361/230, 234; 156/345; 279/128; 269/8, 13; 118/723 R

[56] References Cited

U.S. PATENT DOCUMENTS

| | | | |
|---|---|---|---|
| 4,480,284 | 10/1984 | Tojo | 361/234 |
| 5,350,479 | 9/1994 | Collins et al. | 156/345 |
| 5,792,562 | 8/1998 | Collins | 428/463 |

FOREIGN PATENT DOCUMENTS 0 339 903   11/1989   European Pat. Off. .

OTHER PUBLICATIONS

Lane, "Numerical Modelling of Electrostatic Chucks: De–Chucking; Plasma Dynamics," Presentation to ESC Working Group Meeting, 1–32 (Feb. 1993).

Hartsough, "Electrostatic Wafer Holding," Solid State Technology, 87–90 (Jan. 1993).

Field, "Electrostatic Wafer Clamping: Advanced Temperatures Control for Next–Generation Manufacturing," Publication Unknown, 83–88 (Feb. 1994).

*Primary Examiner*—Timothy M. Speer
*Attorney, Agent, or Firm*—Eric Prahl

[57] ABSTRACT

An electrostatic chuck including a pedestal having a conductive upper surface; and a layer of plasma-sprayed material formed on the upper surface of the pedestal and defining a surface onto which a substrate is placed during use, wherein the plasma-sprayed material exhibits the Johnson-Rahbeck effect when a bias is applied between the substrate and the pedestal.

22 Claims, 3 Drawing Sheets

ELECTROSTATIC CHUCK WITH AN IMPREGNATED, POROUS LAYER THAT EXHIBITS THE JOHNSON-RAHBECK EFFECT

This is a continuation-in-part of U.S. patent application Ser. No. 08/372,177, now U.S. Pat. No. 5,792,562 entitled "Electrostatic Chuck with Polymeric Impregnation and Method of Making", filed Jan. 12, 1995, and incorporated herein by reference.

BACKGROUND OF THE INVENTION

The present invention relates to an improved electrostatic chuck.

In the plasma processing of articles such as semiconductor wafers, a common problem is the coupling of electrical energy to the article being processed. Typically, electromagnetic coupling of RF energy into the source region of a plasma chamber is employed to generate and maintain a high electron density plasma having a low particle energy. In addition, RF bias energy is usually capacitively coupled in the plasma via the article being processed to increase and control the energy of ions impinging on the article.

In a typical high density plasma reactor, the driving point RF bias impedance presented by the plasma is very low. To achieve uniform ion energy and flux to the article being processed (typically essential for etching or other plasma processes), uniform coupling of RF bias energy through the article being processed to the plasma is required. The article, typically a semiconductor wafer, being processed normally is held against some kind of chuck and RF bias energy is applied to the chuck. What is desired is a constant plasma sheath voltage across the surface of the wafer being processed.

The degree to which such a uniform plasma sheath voltage can be achieved is a function not only of the plasma density uniformity as generated by the plasma source, but is also a function of the impedance per unit area of the plasma sheath adjacent to the wafer, the impedance per unit area of the wafer, the impedance per unit area of any gap between the wafer and the chuck and the impedance per unit area of the chuck.

Besides electrical coupling, the chuck should be tightly thermally coupled to the wafer being processed. Typically the temperature of the article is a process parameter to be controlled and this normally means removing heat from or adding heat to the wafer during processing. Heat transfer in a low pressure or vacuum environment such as that used for plasma processing is generally poor. Some means of providing for adequate heat transfer between the wafer being processed and adjacent surfaces is usually necessary.

Gas is typically introduced between the wafer and chuck to enhance thermal contact and heat transfer from the wafer to the chuck. The gas pressure required is a function of the heat load imposed by the plasma, the desired maximum wafer temperature, the temperature at which the chuck can be maintained (such as with liquid cooling), the choice of cooling gas and the wafer/gas and gas/chuck accommodation coefficients (measures of how effectively heat is transferred between a gas and a surface). For biased high density plasma applications, helium gas is used as the cooling gas and the gas pressure required is typically in the 5 to 30 torr range.

For "low pressure" plasma processes (those operating in millitorr pressure range), some means must be provided to allow a significantly higher pressure in the region between the wafer and chuck with respect to the ambient pressure in the process chamber. In addition, a leak of cooling gas into the process environment may produce undesirable results.

Prior art mechanical chucks have proven inadequate for use in the plasma processing of articles such as semiconductor wafers. Mechanically clamped chucks suffer from shortcomings such as mismatches in curvatures between the wafer and the chuck, resulting in a variable gap between such surfaces and consequent non-uniform electrical and thermal coupling.

Electrostatic chucks have successfully overcome the non-uniform coupling associated with mechanical chucks. Electrostatic chucks employ the attractive coulomb force between oppositely charged surfaces to clamp together a wafer and a chuck. In principle, with an electrostatic chuck, the force between wafer and chuck is uniform for a flat article and flat chuck. The electrostatic force between the wafer and the chuck is proportional to the square of the voltage between them, proportional to the relative permittivity of the dielectric medium (typically a ceramic such as alumina) separating them (assuming conductivity is negligible) and inversely proportional with the square of the distance between them. Typically for biased-wafer high density plasma processing application (such as $SiO_2$ etching) a cooling gas is required to improve the heat transfer between the wafer and the chuck to acceptable levels.

Introduction of gas cooling between a wafer and a chuck, while required to achieve adequate heat transfer, can cause problems with prior art electrostatic chucks when used in biased-wafer high density plasma applications. In particular, the requirement of introducing cooling gas in the region between an wafer and a chuck requires that some discontinuity be introduced in the chuck surface, typically some type of hole(s) through the chuck to a gas passage behind the chuck surface. The introduction of any discontinuity in the chuck surface distorts the electric field in the vicinity of the discontinuity, making arc breakdown and glow discharge breakdown of the cooling gas more probable. With DC bias applied between an wafer and a chuck, and RF bias applied to the chuck, gas breakdown becomes probable with prior art electrostatic chucks such as described in U.S. Pat. Nos. 4,565,601 and 4,771,730.

The problems of cooling gas breakdown are addressed by the electrostatic chuck described in U.S. Pat. No. 5,350,479, to Collins et al., assigned to Applied Materials, Inc. and incorporated in it entirety herein by reference. With reference to FIGS. 1–4, an electrostatic chuck 10a as described in the foregoing patent comprises an aluminum pedestal 14a within which a plurality of axially oriented lift pin holes 66a and gas conduits 48a having upper ends 50a are defined. The conduits 48a typically have a diameter of about 0.3 inch (8 mm). The conduits 48a preferably do not extend to the upper surface 40a of the pedestal 14a, but are separated from the surface by a thin intervening layer 60a of aluminum. A dielectric layer 44a of alumina or alumina/titania is plasma-sprayed over the upper surface 40a of the pedestal 14a of the electrostatic chuck 10a and ground to achieve a thickness of about 0.010 inch (0.25 mm).

As best shown in FIG. 3, a plurality of perforations 58a having diameters at least an order of magnitude less than the diameter of conduit 48a are formed through the dielectric layer 44a and the intervening aluminum layer 60a into the upper ends 50a of conduits 48a, preferably by laser drilling. These perforations permit transport of cooling gas from each conduit 48a to the surface of the dielectric layer 44a. In order to distribute the cooling gas from the perforations 58a over the upper face 54a of the dielectric layer 44a, a pattern 18a of one or more gas distribution grooves 55a, 56a is formed in the upper face 54a. These grooves are typically produced by a laser machining operation, and extend over the majority of the surface of the upper face 54a of the dielectric layer 44a. Thus, when a semiconductor substrate or other article is placed on the electrostatic chuck 10a, cooling gas flows through the conduits 48a and perforations 58a into the distribution grooves 55a, 56a, thus cooling the substrate or article.

The foregoing electrostatic chuck can be subjected to high power RF fields and high density plasmas immediately above the substrate chucked thereto without breakdown of the cooling gas due to arcing or glow discharge. However, a number of new problems arise in connection with the foregoing electrostatic chuck.

The dielectric layer 44a typically is formed by a plasma-spraying (also known as flame-spraying) process. Plasma-sprayed dielectric layers, typically finished to thickness in the range from about 50 to 500 $\mu$m, have high dielectric strength in vacuum ($>1.5 \times 10^5$ V/cm).

Plasma-sprayed dielectric layers are, however, somewhat porous, having a typical void fraction of about 1–10% more usually about 1–2%. The pores of such a dielectric layer form a complex three-dimensionally connected network throughout the dielectric layer. The porosity of such a layer can be characterized as "microporosity" or "macroporosity", or as a combination of both types of porosity. "Microporosity" occurs as a result of the shrinkage of the grains of the plasma-sprayed dielectric material upon cooling. "Macroporosity" occurs primarily as a result of inadequate melting of grains of the dielectric material during the plasma-spraying process.

The network of pores can trap contaminants. More importantly, the network of pores forms a conduction path for any mobile charge which is present in the dielectric layer. For example, plasma-sprayed dielectric layers tend to hydrate upon exposure to air. Excessive mobile charge may be generated due to this hydration. Charge may also be injected into the layer if the layer is exposed to plasma and an electric field is applied between the electrostatic chuck and the plasma, which is required to establish the electrostatic force by which the substrate is chucked.

The presence of excessive mobile charge in the plasma-sprayed dielectric layer 44a cn significantly increase the leakage current through the layer at the high electric fields (on the order of $10^5$ V/cm) typically employed with electrostatic chucks used for plasma processing of semiconductor wafers. The increased leakage current in turn degrades the electrostatic force.

A need has existed for an electrostatic chuck in which the leakage current density is substantially reduced or eliminated even in the presence of moisture or injected charge. A need has also existed for a simple method of making such an improved electrostatic chuck.

SUMMARY OF THE PREFERRED EMBODIMENTS

In general, in one aspect the invention is an electrostatic chuck including a pedestal having a conductive upper surface; and a layer of plasma-sprayed material formed on the upper surface of the pedestal and defining a surface onto which a substrate is placed during use. The plasma-sprayed material exhibits the Johnson-Rahbeck effect when a bias is applied between the substrate and the pedestal.

Preferred embodiments have the following features. The layer of plasma sprayed material is a porous dielectric material that is impregnated with a plasma-resistant sealant. The sealant is a cured polymerizable material, which is capable of polymerizing at room temperature in the absence of oxygen and/or is capable of polymerizing at a pressure below 1 atm. The polymerizable material has a viscosity in a range of about 1 to 50 cps. It also includes at least one monomer having the structural formula:

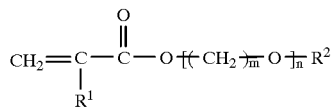

wherein
$R^1$ denotes H or $CH_3$,
$R^2$ denotes H or

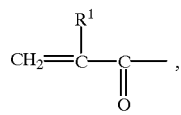

m is 2–4, and
n is 1–22.

More specifically, R1 is $CH_3$ and m is 2. Also, the polymerizable material further includes an effective amount of a polymerization initiator and an accelerator. The accelerator includes about 1–3 wt % of saccharin and about 0.1–1 wt % of N,N-dimethyltoluidene. The sealant is resistant to a fluorine-containing plasma and an oxygen-containing plasma. In addition, the dielectric material is plasma-sprayed alumina or alumina/titania.

In general, in another aspect, the invention is an electrostatic chuck including a pedestal having a conductive upper surface; and a layer of plasma-sprayed material formed on the upper surface of the pedestal and defining a surface onto which a substrate is placed during use. When a bias is applied between the substrate and the pedestal, the plasma-sprayed material exhibits a clamping force that is substantially higher than is producible with the layer being made of an ideal dielectric.

In general, in still another aspect, the invention is an electrostatic chuck including a pedestal having a conductive upper surface; and a layer of porous dielectric material formed on the upper surface of the pedestal. The layer is impregnated with a plasma-resistant sealant and defines a surface onto which a substrate is placed during use. The impregnated porous dielectric material exhibits the Johnson-Rahbeck effect when a bias is applied between the substrate and the pedestal.

In preferred embodiments, the porous dielectric material is a plasma-sprayed material. Alternatively, the porous dielectric material is formed by anodization.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

FIGS. 1–4 illustrate a known electrostatic chuck wherein

FIG. 1 is a top view of a pedestal included in the electrostatic chuck, showing a cooling gas distribution system formed in the upper surface of the dielectric layer bonded to the upper surface of the pedestal;

FIG. 2 is a sectional side view along the lines 3—3 in FIG. 1 showing various internal features of the electrostatic chuck of FIG. 1;

FIG. 3 is an enlarged illustration of a portion of the pedestal and layer of dielectric material within the circle 4a of FIG. 2;

FIG. 4 is an enlarged view of a portion of the upper surface of the pedestal of FIG. 1 showing the relation of gas distribution grooves and perforations;

In the figures, like elements are numbered alike throughout.

DETAILED DESCRIPTION OF THE PREFERRED EMBODIMENTS

Applicants have discovered that application of a plasma-resistant sealant material to a porous dielectric layer of an electrostatic chuck achieves the desired substantial reduction of the observed leakage current. Sealant materials used according to the invention impregnate the porous dielectric layer, filling substantially all of the pores of the porous dielectric layer. The conduction path for the leakage current which characterized previous electrostatic chucks having porous dielectric layers is blocked, substantially reducing the leakage current density.

Figure 1:
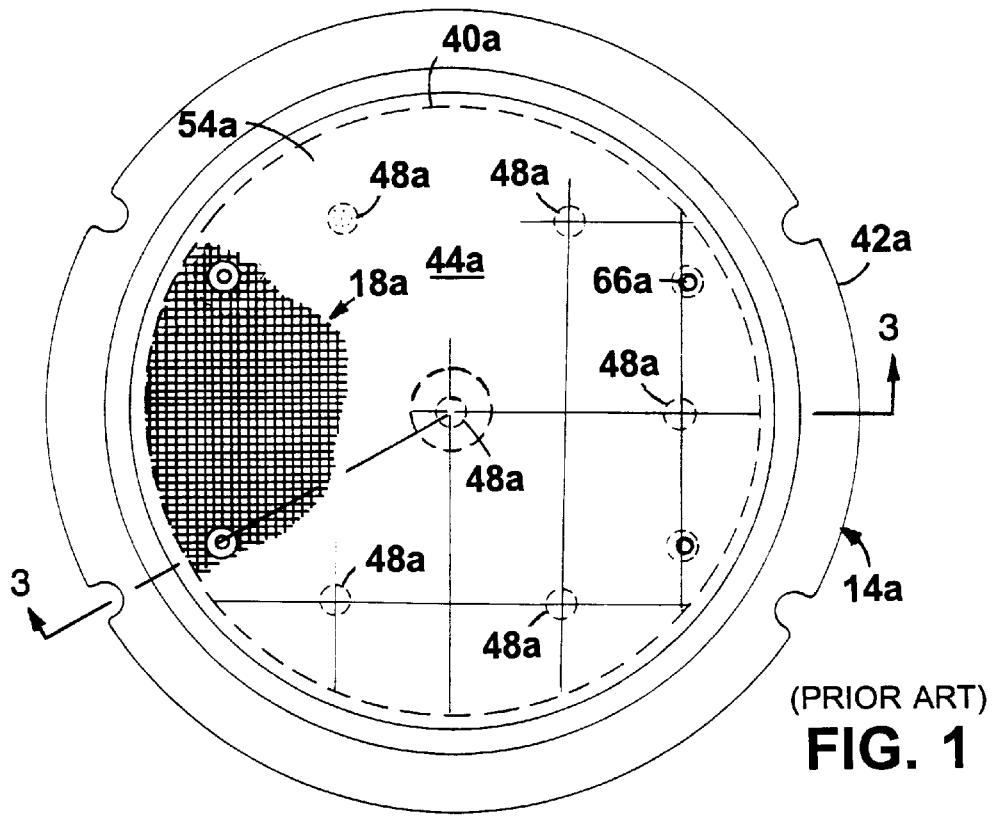
Figure 2:
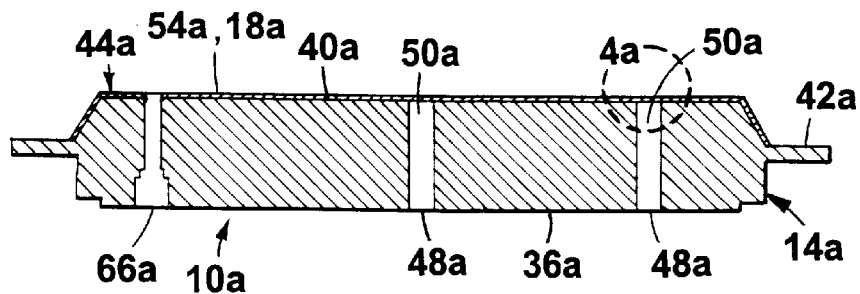
Figure 4:
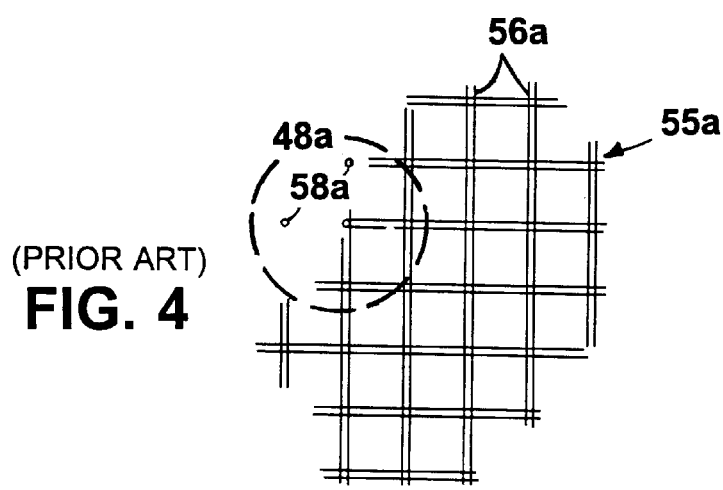
Figure 3:
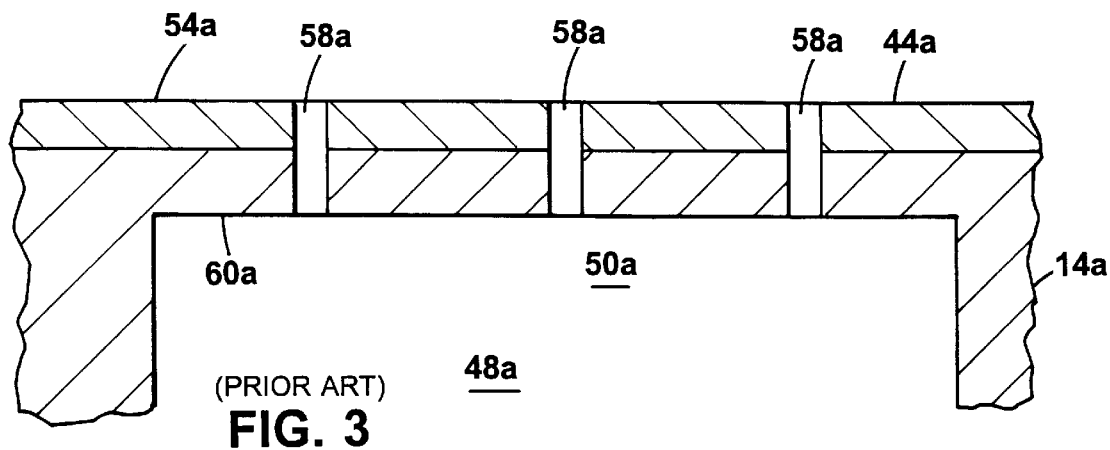
Figure 5:
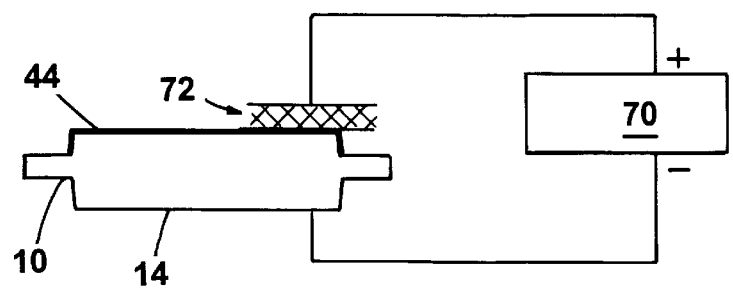
FIG. 5 illustrates a wet deionized water electrical leakage test employed to measure leakage current density in a sealed electrostatic chuck according to the invention.

The effectiveness of a particular sealant in reducing the leakage current density can be assessed using the following "wet" deionized water electrical leakage test. A 100 V DC voltage source 70, which includes a megohm meter, is connected to the metal pedestal 14 of the electrostatic chuck 10 to be tested as shown in FIG. 5. Voltage source 70 is also connected to sponge probe 72, which is saturated with deionized water. Sponge probe 72 has an area of about 6.45 $cm^2$ and is placed in contact with dielectric layer 44 (typically having a thickness that can vary from about 50 to 500 $\mu$m) of electrostatic chuck 10. Sponge probe 72 is maintained in contact with dielectric layer 44 for a minimum of 2 minutes, preferably about 2–4 minutes. A test electric field of $2.5 \times 10^3$ V/cm is employed.

The tested sealant is acceptable according to the invention if a leakage current density of less than 1 $mA/cm^2$ is observed. Preferably, the observed leakage current density is less than 1 $\mu A/cm^2$, and very preferably the leakage current density is less than 100 $nA/cm^2$.

The sealant material employed according to the invention also must be resistant to attack and degradation by plasma. The plasma-resistance of a particular sealant can be assessed using the following test procedure. A semiconductor wafer is chucked to an electrostatic chuck, which has been treated with the sealant to be evaluated, in a chamber of a plasma processing apparatus as described in U.S. Pat. No. 5,350,479. A high density oxygen plasma (100 sccm, 4 mTorr) having an electron density $n_0$ of $5 \times 10^{11}$ electrons/$cm^3$, is produced. A voltage of 1250 V is established between the plasma and the base of the electrostatic chuck, with the plasma being positive and the chuck base being negative. The magnitude of the electric field is approximately $3 \times 10^4$ V/cm.

Helium is used to pressurize the gap between the electrostatic chuck and the semiconductor wafer to 15 Torr.

Over the course of 12-hour plasma exposure, the leakage current density is monitored as described previously. Helium leakage is also monitored.

A sealant is acceptable according to the invention if the observed leakage current throughout the 12-hour plasma exposure does not exceed 1 $mA/cm^2$, more preferably 1 $\mu A/cm^2$, and very preferably 100 $nA/cm^2$, and if the helium leakage does not exceed 10 sccm, preferably 2–3 sccm.

The foregoing test is described in terms of an oxygen plasma. A similar test can be carried out to determine the plasma resistance of a sealant to any desired plasma. For example, oxide etching applications employ fluorine-containing plasmas and optionally oxygen plasmas. Silicon or aluminum etching processes typically employ chlorine-containing plasmas. Various sealants will be useful with fluorine-containing plasmas, while others are more suitable for use with chlorine- or oxygen-containing plasmas. The suitability of any particular sealant can readily be determined by one of ordinary skill by recourse to the testing procedure described above as adapted for the particular plasma of interest.

The sealant material useful according to the invention desirably also have the following properties. The sealant material should be able to penetrate deep into the porous dielectric layer in order to seal the layer effectively. The sealant material should furthermore have a high dielectric strength itself, preferably approximately the same order of magnitude as that of the dielectric material in the absence of injected charge from plasma or moisture (e.g., about $10^5$ V/cm). Preferably as well, the sealant material should form an effective seal at or near room temperature (25° C.), in order to avoid the necessity for thermal cycling of the electrostatic chuck during fabrication. The sealant material desirably has a low vapor pressure.

Applicants have determined in particular that liquid polymerizable materials which have low viscosity and which can be polymerized or cured anaerobically at or about room temperature, and preferably at pressures less than 1 atmosphere, can be employed to produce sealant materials having the desirable properties as set forth above.

A "liquid polymerizable material" as used herein denotes a material which is liquid at or around room temperature and includes at least one monomer which is capable of being polymerized. The liquid polymerizable material can include a mixture of two or more polymerizable monomers if desired.

The liquid polymerizable material preferably has a low viscosity, in order to facilitate penetration of the material into the porous dielectric layer to fill substantially all of the pores of the layer. Very preferably the liquid polymerizable material fills substantially the entire pore volume.

In general, a liquid polymerizable material has a sufficiently low viscosities if it is capable of penetrating an 0.1 to 1-mm thick sample of the porous dielectric material which forms the layer to be sealed, in a time up to about 1 to 5 minutes. Penetration of the liquid polymerizable material through the layer can be determined by visual or tactile inspection.

Particularly suitable viscosities for liquid polymerizable materials useful according to the invention do not exceed about 50 cps, more preferably falling in the range from about 1–50 cps, very preferably ranging from about 1–10 cps. Materials having higher viscosities are more suitable for sealing predominantly "macroporous" dielectric materials. Conversely, materials having lower viscosities are more suitable for sealing predominantly "microporous" dielectric materials.

Liquid polymeric materials having suitable viscosities are particularly beneficially employed according to the invention if they are also curable at or about room temperature and at, and preferably below, 1 atmosphere, more preferably below about 100 mTorr.

Specific liquid polymerizable materials which are useful according to the invention include at least one (meth) acrylate or di(meth)acrylate monomer having the structural formula I:

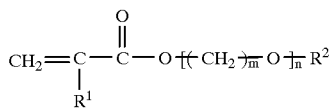

wherein
R$^1$ denotes H or CH$_3$,
R$^2$ denotes H or

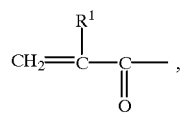

m is 2–4, and
n is 1–22.

In formula I, R$^1$ preferably is CH$_3$. The index m preferably is 2, and the index n preferably 4–8, very preferably 4.

The liquid polymerizable materials useful according to the invention preferably also include one or more additives conventionally employed with polymerizable mixtures. Such additives include polymerization initiators, accelerators such as organic cyclic sulfimides, e.g., benzoic sulfimide (saccharin) and tertiary amines, e.g., N,N-dialkyltoluidenes such as N,N-dimethyl-p-toluidene, and chelating agents such as sodium EDTA (tetrasodium ethylenediaminetetraacetate). Solvents (preferably non-aqueous solvents) may be used, but generally are not necessary.

Preferably, the liquid polymerizable mixture includes an effective amount of a polymerization initiator or combination of initiators. Such polymerization initiators in particular include free-radical polymerization initiators which are capable of initiating polymerization of the monomer or monomers of the mixture in the substantial absence of oxygen, and yet not initiate polymerization as long as oxygen is present. Initiators having the foregoing characteristics include peroxy initiators, such as peroxides, hydroperoxides and peresters. Hydroperoxy initiators, in particular organic hydroperoxides such as cumene hydroperoxide are particularly preferred.

The amount of initiator used is an effective amount capable of initiating polymerization of the monomer or monomers in the liquid polymerizable mixture under the selected curing conditions (e.g., in air, in the absence of oxygen, etc.). Anaerobic initiators that initiate polymerization in the absence of oxygen but do not initiate polymerization if oxygen is present are particularly preferred. The amount of initiator is in general between about 0.1 and 10 percent by weight of the non-volatile components of the liquid polymerizable composition, more particularly between about 0.5 and 5 percent by weight of the composition.

It is very preferred that the liquid polymerizable mixture have a low level of contaminants that can degrade the performance of semiconductor devices fabricated using an electrostatic chuck of the invention. Such contaminants include metals such as alkali and alkaline earth metals (e.g., sodium, potassium), iron, copper, zinc, etc. The amount of such contaminants in the polymerizable mixture preferably is less than about 1 ppm.

Preferred formulations of liquid polymerizable materials useful according to the invention comprise about 90–99 wt % of a polymerizable monomer or combination of monomers of formula I, about 0.1–10 wt %, more preferably about 2–6%, of a polymerization initiator, and about 0–10 wt %, more preferably 0.1–4 wt %, of an accelerator or combination of accelerators, with all percentages based on the total weight of the non-volatile components of said polymerizable mixture. Preferred monomers according to formula I include the acrylates and dimethacrylates of polyethylene glycol 400 (a product having an average of 9 repeating ethoxy units per polymer), as well as combinations of tetraethylene glycol dimethacrylate and hydroxyethyl methacrylate, for example about 70–90 wt % of tetraethylene glycol dimethacrylate and about 30–10 wt % of hydroxyethyl methacrylate. Preferred accelerator combinations include mixtures of saccharin, N,N-dimethyl-p-toluidene and/or tetrahydroquinoline, for example about 1–3 wt % of saccharin and about 0.1–1 wt % of N,N-dimethyltoluidene.

Specific sealant formulations that are suitable for use according to the instant invention include Loctite 290 and 990 adhesive sealants (commercially available from Loctite Corporation, Newington, Conn.), and Perma-Lok HL 126 (commercially available from Permabond International Corporation, Englewood, N.J.). Additional sealant formulations which can be employed according to the instant invention are described in U.S. Pat. No. 5,256,450, to Catena, which is incorporated herein in its entirety by reference.

Plasma-resistant sealants can be used according to the invention to impregnate any porous dielectric material employed to form the dielectric layer of an electrostatic chuck. Typical porous dielectric material employed for such purposes include plasma-sprayed alumina and alumina/titania, for example 97% alumina/3% titania.

The porous dielectric layer of the electrostatic chuck can be impregnated with the selected sealant according to the invention in any desired way. In the preferred embodiment in which the sealant is formed by curing a liquid polymerizable material, the dielectric layer can be impregnated by conventional means such as brushing, spraying, or dipping. The surface of the dielectric layer should be cleaned and dried prior to impregnation. In particular, any machining and drilling residues remaining on the surface of the dielectric layer should be removed.

Impregnation is followed by a curing step in which the liquid polymerizable material is polymerized within the pores of the dielectric layer. The cure step preferably is carried for about 8 to 48 hours at room temperature.

When the selected liquid polymerizable material is an anaerobically curable material, the cure step preferably is carried out in the absence of oxygen. Very preferably, the cure step is at least partially carried out under reduced pressure, particularly in a vacuum of about 100 mTorr or less. Curing can initially be carried out in the presence of air and at atmospheric pressure, followed by a continuation of the curing step in the absence of oxygen under reduced pressure. Curing the liquid polymerizable material under reduced pressure generally is beneficial in reducing the time required for cure.

Beneficially, the impregnation and cure steps are repeated sequentially at least twice, in order to assure that substantially all of the pores of the porous dielectric material are filled by the sealant.

The impregnation and cure steps can be carried out at any point during manufacture of the electrostatic chuck. When a liquid polymerizable material is employed, the material can be applied immediately after formation of the porous dielectric layer of the electrostatic chuck, e.g., after plasma spraying; after the dielectric layer is ground to the final desired thickness; after completion of any drilling and machining steps, e.g., after formation of perforations, gas distribution grooves, etc. If a liquid polymerizable material is applied after drilling and machining of the electrostatic chuck, care should be exercised to ensure that the material does not seal any of the drilled or machined structures. Preferably, all drilled and machined structures are purged, for example with nitrogen at about 60–90 psia, in order to prevent undesired sealing.

The invention is further described by reference to the following non-limiting examples.

Examples 1–2 set forth sealants which are useful according to the instant invention.

| Ingredient | Example 1[a] | Example 2[b] |
|---|---|---|
| Polyglycol dimethacrylate (CAS No. 25852-47-5) | 90–95 wt % | |
| Tetraethylene glycol dimethacrylate (CAS No. 109-17-1) | | 75 wt % |
| Hydroxyethyl methacrylate (CAS No. 868-77-9) | | 15 wt % |
| Cumene hydroperoxide | 3–5 wt % | 3 wt % |
| Saccharin | 1–3 wt % | 3 wt % |
| N,N-dialkyltoluidenes (CAS no. 613-48-9) | 0.1–1 wt % | |
| N,N-dimethyl-p-toluidene (CAS No. 99-97-8) | | 1 wt % |

[a]Commercially available from Loctite Corp. as Product 990
[b]Commercially available from Permabond Intl. as Perma-Lok HL 126

EXAMPLE 3

An electrostatic chuck having a porous dielectric layer comprised of 97 wt % alumina/3 wt % titania (thickness 0.18 mm) in which helium distribution grooves and perforations are formed as described in U.S. Pat. No. 5,350,479, is sealed according to the invention using the following procedure.

Residues from the drilling and machining processes used to form the grooves and perforations are removed by manually shaving across the upper surface of the dielectric layer with a clean, sharp-edged alumina ceramic plate while the helium distribution system of the chuck is purged with clean, dry nitrogen (90 psia). The chuck is then thoroughly cleaned using isopropyl alcohol, wiped with a clean, lint-free cloth, and blow-dried with clean, dry nitrogen. The cleaned and dried chuck is immediately placed in a vacuum chamber at 30 mTorr for 60 minutes.

Next, the helium distribution system of the chuck is again purged with clean, dry nitrogen at 90 psia. While the nitrogen is flowing, 20–30 cm$^3$ of Perma-Lok HL 126 are applied uniformly to the surface of the dielectric layer of the chuck using a clean, lint-free cloth. After 30 minutes, the nitrogen purge is stopped, and the chamber is evacuated to 30 mTorr. After 8 hours, a second coating of the sealant is applied, followed by nitrogen purge cessation and chamber evacuation as described.

Optionally, after another 8 hours, a third coating can be applied by repeating the foregoing steps.

EXAMPLE 4

A sealed electrostatic chuck produced according to Example 3 of the invention was compared with an otherwise identical electrostatic chuck which was not sealed.

The unsealed and sealed chucks were tested using two procedures, "wet" and "dry". The "wet" test procedure is described above. The "dry" test procedure is similar to the "wet" test procedure, but a planar copper electrode having an area of 6.45 cm$^2$ is used instead of a sponge probe. The chucks are also treated to remove residual moisture prior to measurement in the "dry" test. The chucks are baked at 105° C. for at least 30 minutes, then placed in a vacuum chamber evacuated to 30 mTorr for at least 30 minutes, and subsequently cooled to 25° C. in a dry environment. Testing is carried out at a pressure of 1 atmosphere.

All measurements were made at 2 minutes dwell time per data point.

For each test procedure, the test voltage (V) was forced, the current (I) or the resistance (R) was measured, and the electric field (E) and current density (J) were calculated on the basis of the foregoing measurements. Results are set forth in Tables I–IV below.

TABLE 1

Unsealed chuck, dry test

| V (volts) | R (ohms) | I (amps) | E (V/cm) | J (A/cm$^2$) |
|---|---|---|---|---|
| 100 | >10$^{10}$ | <1.5 × 10$^{-9}$ | 5.6 × 10$^3$ | <0.23 × 10$^{-9}$ |
| 250 | >10$^{10}$ | <3.9 × 10$^{-9}$ | 13.9 × 10$^3$ | <0.60 × 10$^{-9}$ |
| 500 | >10$^{10}$ | <7.8 × 10$^{-9}$ | 27.8 × 10$^3$ | <1.30 × 10$^{-9}$ |
| 1000 | >10$^{10}$ | <1.5 × 10$^{-8}$ | 55.6 × 10$^3$ | <2.33 × 10$^{-9}$ |
| 2500 | 10$^8$ | 3.8 × 10$^{-6}$ | 139 × 10$^3$ | 0.59 × 10$^{-6}$ |
| 5000 | 0 | short | 278 × 10$^3$ | short |

TABLE II

Unsealed chuck, wet test

| V (volts) | R (ohms) | I (amps) | E (V/cm) | J (A/cm$^2$) |
|---|---|---|---|---|
| 100 | 0 | short | 5.6 × 10$^3$ | short |
| 250 | 0 | short | 13.9 × 10$^3$ | short |
| 500 | 0 | short | 27.8 × 10$^3$ | short |
| 1000 | 0 | short | 55.6 × 10$^3$ | short |
| 2500 | 0 | short | 139 × 10$^3$ | short |
| 5000 | 0 | short | 278 × 10$^3$ | short |

TABLE III

Sealed chuck, dry test

| V (volts) | R (ohms) | I (amps) | E (V/cm) | J (A/cm$^2$) |
|---|---|---|---|---|
| 100 | >10$^{10}$ | <1.5 × 10$^{-9}$ | 5.6 × 10$^3$ | <0.23 × 10$^{-9}$ |
| 250 | >10$^{10}$ | <3.9 × 10$^{-9}$ | 13.9 × 10$^3$ | <0.60 × 10$^{-9}$ |

TABLE III-continued

Sealed chuck, dry test

| V (volts) | R (ohms) | I (amps) | E (V/cm) | J (A/cm$^2$) |
|---|---|---|---|---|
| 500 | >10$^{10}$ | <7.8 × 10$^{-9}$ | 27.8 × 10$^3$ | <1.30 × 10$^{-9}$ |
| 1000 | >10$^{10}$ | <1.5 × 10$^{-8}$ | 55.6 × 10$^3$ | <2.33 × 10$^{-9}$ |
| 2500 | >10$^{10}$ | <3.8 × 10$^{-8}$ | 139 × 10$^3$ | <5.9 × 10$^{-9}$ |
| 5000 | >10$^{10}$ | <7.7 × 10$^{-8}$ | 278 × 10$^3$ | <11.9 × 10$^{-9}$ |

TABLE IV

Sealed chuck, wet test

| V (volts) | R (ohms) | I (amps) | E (V/cm) | J (A/cm$^2$) |
|---|---|---|---|---|
| 100 | >10$^{10}$ | <1.5 × 10$^{-9}$ | 5.6 × 10$^3$ | <0.23 × 10$^{-9}$ |
| 250 | >10$^{10}$ | <3.9 × 10$^{-9}$ | 13.9 × 10$^3$ | <0.60 × 10$^{-9}$ |
| 500 | >10$^{10}$ | <7.8 × 10$^{-9}$ | 27.8 × 10$^3$ | <1.30 × 10$^{-9}$ |
| 1000 | >10$^{10}$ | <1.5 × 10$^{-8}$ | 55.6 × 10$^3$ | <2.33 × 10$^{-9}$ |
| 2500 | >10$^{10}$ | <3.8 × 10$^{-8}$ | 139 × 10$^3$ | <5.9 × 10$^{-9}$ |
| 5000 | >10$^{10}$ | <7.7 × 10$^{-8}$ | 278 × 10$^3$ | <11.9 × 10$^{-9}$ |

As is evident from the foregoing comparison, the unsealed electrostatic chuck performs acceptably according to the dry test for voltages up to about 2500 V, at which point the leakage current across the dielectric layer becomes excessive. However, the unsealed chuck fails the wet test at all voltages, showing the presence of unacceptable conduction paths due to the connected porosity of the unsealed dielectric layer. Thus, the unsealed ceramic coating exhibits high dielectric strength in the absence of injected charge, but in the presence of injected charge the dielectric strength is inadequate for use as a dielectric layer on an electrostatic chuck.

In contrast, the sealed electrostatic chuck according to the invention is characterized by very small leakage current densities at all voltages, whether measured according to the dry or wet test. The low leakage currents observed in the wet test indicate that the connected porosity of the dielectric layer has been substantially completely filled.

The present invention thus provides an improved electrostatic chuck in which leakage current density is significantly reduced. The improved chucks thus show extended service life and higher reliability.

The Johnson-Rahbeck Effect:

We have observed that an E-chuck which uses the impregnated, plasma-sprayed layer described herein unexpectedly exhibits the Johnson-Rahbeck effect. In other words, it generates a clamping force that is far higher than expected for an E-chuck that uses an ideal dielectric layer.

To understand the Johnson-Rahbeck effect, consider two parallel metal plates or electrodes that are separated from each other by an ideal dielectric material. As is well known, if a voltage is applied between the two plates, they will attract each other with a force that is equal to:

$$F = K\left(\frac{V}{d}\right)^2 \quad (1)$$

where V is the voltage across the two plates, d is the thickness of the dielectric layer, and K is a constant which is determined by other system characteristics such as the dielectric constant of the dielectric layer and the area of the two plates.

The Johnson-Rahbeck effect occurs when the material separating the plates is not an ideal dielectric but is instead a material (e.g. certain semiconductors) that allows a limited amount of charge to migrate through it. As a result of the charge migration, the attractive force between the two plates increases significantly.

Basically, the phenomenon occurs as follows. When the voltage is applied between the two electrodes, charges accumulate on either side of the dielectric layer separating the two electrodes. If one electrode is a semiconductor wafer and the other electrode is the metal body of an E-chuck, and if the wafer is positively biased with respect to the metal E-chuck, then electrons will accumulate at the interface between the dielectric layer and the top of the metal chuck and positive charge (i.e., created by the depletion of electrons) will accumulate at the interface between the backside of the wafer and the top of the dielectric layer. The attractive force produced by these two charge layers holds the wafer to the chuck with a force that is equal to that described in Eq. 1.

If the layer separating the two electrodes (i.e., the wafer from the metal body of the E-chuck) is made of another material that allows charge to migrate through it, then the negative charge, which had previously accumulated at the interface between the dielectric layer and the metal body of the E-chuck, will migrate up through the layer toward the backside of the wafer and it will accumulate at the top of the layer near the backside of the wafer. Since the backside of the wafer and the layer are not perfectly flat, actual contact between the backside and the layer will only occur at points and at those points charge will flow to the backside of the wafer. In between those points of contact, however, there will be gaps separating the backside of the wafer from the semiconductor layer and the change will not be able to flow into the wafer. Rather, charge will accumulate on the surface of the layer in these gap regions and produce an attractive force on the wafer. Since the distance across these gaps is very small (i.e., typically much smaller than the thickness of the layer), the force will be considerably higher. This is readily apparent from Eq. (1), which shows that the force increases with decreasing distance as $(1/d)^2$. In reality, the equation for the actual force is more complex because the interface between the backside of the wafer and the top of the structure cannot be modeled as a simple parallel plate capacitor structure. That is, the gaps are not of uniform width and there are multiple points of actual electrical contact between the layer and the backside of the wafer. Nevertheless, the principle still applies, the force which is generated due to the Johnson-Rahbeck effect will be considerably higher than that which is observed in a conventional parallel plate capacitor structure that uses an ideal dielectric for the material separating the two electrodes.

Obviously in an E-chuck, it is desirable to find materials that produce the Johnson-Rahbeck effect because they produce substantially higher clamping forces (i.e., the electrostatic force holding the wafer onto the E-chuck) for a given bias voltage as compared to the clamping force that is achieved on E-chucks which use more conventional dielectric layers. Conversely, to achieve a given clamping force, one can use a much smaller voltage than is required in the case of an E-chuck which uses a conventional dielectric layer.

It is possible to calculate the force for an E-chuck that has an ideal dielectric layer using the following equation:

$$F = \frac{1}{2}\frac{CV^2}{d}, \quad (2)$$

where C is the capacitance formed by the backside of the wafer separated from the metal surface of the E-chuck by the dielectric layer of thickness d, and V is the voltage of the wafer relative to the metal body of the E-chuck. In this case, the capacitance C can be calculated as follows:

$$C = \frac{A \times \epsilon_o \times \epsilon_r}{d}, \quad (3)$$

where A is the area of the wafer, $\epsilon_o$ is the dielectric constant of free space, and $\epsilon_r$ is the relative dielectric constant of the dielectric layer. Thus, substituting Eq. 3 into Eq. 2:

$$F = \frac{1}{2}\frac{A \times \epsilon_o \times \epsilon_r \times V^2}{t^2}. \quad (4)$$

If helium is supplied to the backside at a pressure $P_{torr}$, this produces an upward force on the wafer of $A \cdot P_{torr}$. It is now possible to compute the pressure that is required to separate the wafer from the E-chuck that has a voltage V on it, i.e., that is sufficient to overcome the electrostatic force holding the wafer onto the E-chuck. It is equal to F/A. The second column of the following table V presents the maximum $P_{torr}$ that can be used on a conventional E-chuck which has an ideal dielectric layer on its top surface for the voltage specified in the first column.

TABLE V

| Voltage (volts) | $P_{torr}$ (ideal) | $P_{torr}$ (J-R) |
|---|---|---|
| 199 | 0.365 | 4 |
| 298 | 0.819 | 7 |
| 387 | 1.381 | 15 |
| 483 | 2.151 | 25 |
| 561 | 2.901 | >30 |
| 796 | 5.840 | >30 |

For the numbers appearing in the second column, the following values were used:
A=0.031 m²
d=0.018 cm=0.00018 m
$\epsilon_o$=8.85×10⁻¹² F/m
$\epsilon_r$=9 for $Al_2O_3$ The third column represents actual measurements using an E-chuck that had an impregnated, plasma-sprayed layer fabricated in accordance with the present invention. The thickness of the layer was 0.018 cm. The pressure measurements were obtained by setting the voltage on the E-chuck to the specified value and then increasing the backside pressure until the gas leakage rate started rising significantly, indicating that the wafer was being forced up off of the E-chuck. The particular apparatus that was used for these measurements could only measure pressures as high as 30 Torr. Thus, the actual force produced for the last two voltages (i.e., for 561 and 796 volts) could not be measured.

As can be seen, the clamping force is substantially higher than would be expected for an ideal dielectric layer. We did our measurements at −10° C. We expect that the phenomenon will increase as the temperature increases. Thus at 30° C. the effect will be even more pronounced. In addition, we also observed that the phenomenon occurs with both polarities of chuck bias voltage.

This performance was not expected from other electrical measurements that we had performed on the plasma-spayed layer. When the leakage current was measured, it was so small that the layer appeared to be very close to an ideal dielectric layer. In addition, the measured resistances of the plasma-sprayed layer were on the order of Giga-ohms, which would lead one to expect that it would not exhibit the Johnson-Rahbeck effect. However, as indicated above the experimental evidence surprisingly indicated to the contrary. During use (i.e., when a voltage is applied between the substrate and the chuck), the film exhibits properties that can only be explained by a charge migration such as occurs during the Johnson-Rahbeck effect. That is, the force holding the wafer to the chuck increases substantially above that which would be expected from an ideal dielectric.

With the impregnated, plasma-sprayed layer, we are able to run the E-chuck at substantially lower voltages than were previously possible using a conventional dielectric layer. Previously, 1200 volts was typically required as a bias voltage, but with the impregnated, plasma-sprayed layer that voltage can be lowered to 800 volts. Moreover, even at 800 volts we found that it is possible to run a 15 Torr backside pressure without fear of dislodging the wafer from the E-chuck and without fear of producing serious leakage of backside gas.

We have also observed that the surface of the chuck can be exposed to an atomic oxygen plasma for hundreds of hours and there is no serious degradation in the phenomenon. Typically such a plasma is used to clean the inside of the chamber including the chuck between wafer processing runs.

Plasma Processing Chamber with an E-Chuck

Figure 6:
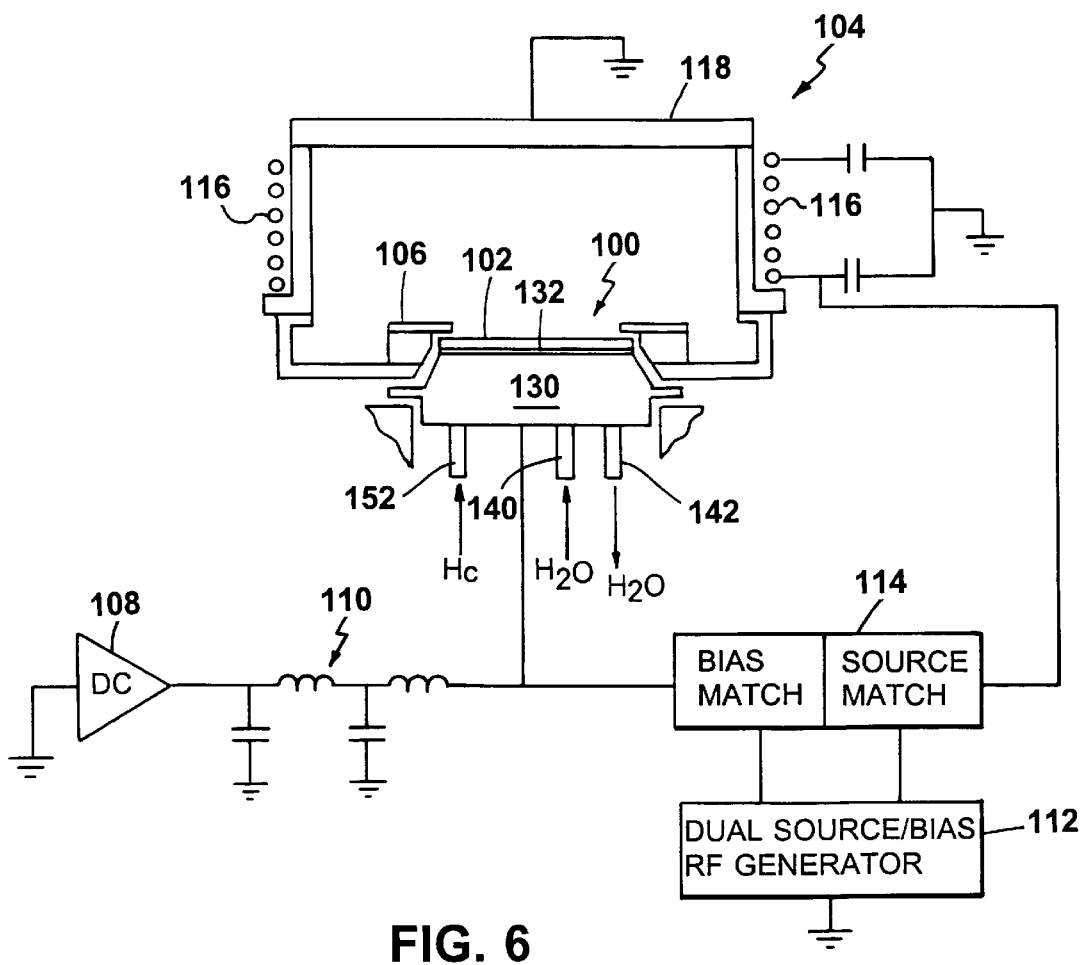
FIG. 6 is a schematic diagram of a representative plasma processing system which uses the E-chuck described herein.

As shown in FIG. 6, a plasma processing system includes an E-chuck 100 which electrostatically holds a wafer 102 that is to be processed within a high density plasma reaction chamber 104. E-chuck 100 includes a metal (e.g. aluminum) pedestal 130 (or body) which is coated with an impregnated, plasma-sprayed layer 132 of the type described above. A cover ring 106 which prevents the plasma that is generated in the chamber above the wafer from contacting, and thereby damaging E-chuck 100.

The electrical circuit for the plasma reaction chamber 104 is conventional. RF source power and RF bias power are each coupled from a conventional RF power supply 112 through a matching network 114, with the source power coupled to an inductive antenna 116 surrounding the outside of chamber 104 and the bias power coupled to pedestal 130. A grounded counter electrode 118, which forms the top of chamber 104, provides a ground reference for both the RF bias power and the DC supply described below. The plasma reaction chamber 104 introduces inductively-coupled RF power through antenna 116 into the chamber to generate and maintain a high density, low energy plasma within the chamber. RF bias power is capacitively coupled to the plasma within the chamber via wafer 102 and E-chuck 100, with the grounded counter electrode 118 located in the plasma source region providing a return path for bias current. With the configuration shown in FIG. 6, plasma density is controlled by the RF source power, and ion energy is independently controlled by the RF bias power. The result is a uniform high density, low electron temperature plasma at wafer 102 with ion energy controllable from about 15 eV to several hundred eV. This configuration allows for etching of wafer 102 with minimum charge up degradation and minimum energetic-particle damage.

The plasma processing system also includes a conventional DC voltage source 108 which supplies the clamping voltage to E-chuck 10 through a low pass filter 110 that isolates DC voltage source 108 from the RF power supply 112. DC voltage source 108 supplies bias voltage to E-chuck 100 to develop an electric field which electrostatically holds or clamps wafer 102 to pedestal E-chuck 100. When it is necessary to release (or "de-chuck") wafer 102, source 108 may be switched either to a zero output voltage or to a reverse polarity voltage if it is desired to accelerate the release of the wafer.

Pedestal 130 in the E-chuck 100 is a one piece aluminum block with internal liquid cooling. Liquid coolant (e.g. water) enters an inlet 140 at an underside of the pedestal, travels through cooling passages (not shown) within the pedestal, and exits through an outlet 142. The construction of the pedestal is similar to the one shown in FIGS. 1–4 and previously described, except that the impregnated plasma-sprayed layer is used in place of the conventional dielectric layer. A cooling gas, such as helium, is fed to pedestal 130 through an inlet 152 and distributed into axially oriented gas conduits or cavities within the pedestal. The cooling gas then passes up from each conduit or cavity through a plurality of laser-drilled perforations to the surface of E-chuck 100. On the surface of E-chuck 100, a pattern of one or more gas distribution grooves formed in the upper face of the pedestal distribute the cooling gas to the backside of the wafer.

Of course, the plasma processing system which is described herein and the particular pedestal design that was selected are presented merely for illustrative purposes. It should be understood that the E-chuck of the present invention can be used in any system in which employs an electrostatic chuck.

A typical run includes the following sequence of steps. Using a mechanical robot mechanism (not shown), the wafer is insert into the plasma processing chamber and placed onto the E-chuck. The chamber is then sealed and argon pressure is built up to a level at which plasma ignition will readily occur. When the chamber has reached an appropriate pressure, the source of power is turned on and tuned to produce plasma ignition. With the plasma ignited, the pressure in the chamber is dropped to a lower level at which plasma processing will take place and the bias voltage to the E-chuck is turned on (e.g. +800 volts DC). About 2–3 seconds after turning on the E-chuck bias voltage, the helium back pressure to the wafer can be increased to its full level (e.g. 15 Torr). Then the plasma process can be initiated including turning on the RF bias to the E-chuck. The entire initialization procedure, including the rise in the clamping force to its operational level, typically takes only about 6–8 seconds.

Other embodiments of the invention are within the following claims. For example, the plasma-resistant impregnation can also be used in other porous dielectric materials such as the anodized layer which is formed by anodizing the top surface of the E-chuck. The anodized layer exhibits similar characteristics to the plasma-sprayed layer described herein. That is, it exhibits interconnected porosity and unacceptably high leakage currents. Impregnating the anodized layer will reduce the leakage current and will also produce a layer which exhibits the Johnson-Rahbeck effect.

What is claimed is:

1. An electrostatic chuck comprising:
   a pedestal having a conductive upper surface; and
   a layer of plasma-sprayed material formed on the upper surface of the pedestal and defining a surface onto which a substrate is placed during use, wherein said plasma-sprayed material exhibits the Johnson-Rahbeck effect when a bias is applied between the substrate and the pedestal.

2. The electrostatic chuck of claim 1, wherein the layer of plasma sprayed material comprises a porous dielectric material that is impregnated with a plasma-resistant sealant.

3. The electrostatic chuck of claim 1, wherein said sealant is a cured polymerizable material.

4. The electrostatic chuck of claim 3, wherein said polymerizable material is capable of polymerizing at room temperature in the absence of oxygen.

5. The electrostatic chuck of claim 4, wherein said polymerizable material is capable of polymerizing at a pressure below 1 atm.

6. The electrostatic chuck of claim 4, wherein said polymerizable material has a viscosity in a range of about 1 to 50 cps.

7. The electrostatic chuck of claim 4, wherein said polymerizable material comprises at least one monomer having the structural formula:

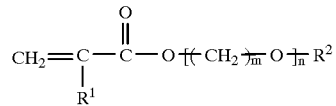

wherein
R$^1$ denotes H or CH$_3$,
R$^2$ denotes H or

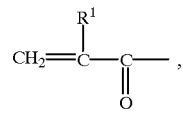

m is 2–4, and
n is 1–22.

8. The electrostatic chuck of claim 7, wherein R1 is CH3.

9. The electrostatic chuck of claim 7, wherein m is 2.

10. The electrostatic chuck of claim 7, wherein said polymerizable material further comprises an effective amount of a polymerization initiator.

11. The electrostatic chuck of claim 10, wherein said polymerizable material is cumene hydroperoxide.

12. The electrostatic chuck of claim 7, wherein said polymerizable material further comprises an accelerator.

13. The electrostatic chuck of claim 12, wherein said accelerator comprises about 1–3 wt % of saccharin and about 0.1–1 wt % of N,N-dimethyltoluidene.

14. The electrostatic chuck of claim 2, wherein said sealant is resistant to a fluorine-containing plasma and an oxygen-containing plasma.

15. The electrostatic chuck of claim 2, wherein said dielectric material is plasma-sprayed alumina or alumina/titania.

16. An electrostatic chuck comprising:
    a pedestal having a conductive upper surface; and
    a layer of plasma-sprayed material formed on the upper surface of the pedestal and defining a surface onto which a substrate is placed during use, wherein when a bias is applied between the substrate and the pedestal said plasma-sprayed material exhibits a clamping force that is substantially higher than is producible with said layer being made of an ideal dielectric.

17. An electrostatic chuck comprising:
    a pedestal having a conductive upper surface; and
    a layer of porous dielectric material formed on said upper surface of said pedestal, said layer being impregnated with a plasma-resistant sealant and defining a surface onto which a substrate is placed during use, wherein said impregnated porous dielectric material exhibits the Johnson-Rahbeck effect when a bias is applied between the substrate and the pedestal.

18. The electrostatic chuck of claim 17 wherein said porous dielectric material is a plasma-sprayed material.

19. The electrostatic chuck of claim 17 wherein said porous dielectric material is formed by anodization.

20. An electrostatic chuck comprising:

a pedestal having a conductive upper surface; and a layer of porous dielectric material formed on said upper surface of said pedestal, said layer being impregnated with a plasma-resistant sealant and defining a surface onto which a substrate is placed during use, wherein when a bias is applied between the substrate and the pedestal said impregnated, porous material exhibits a clamping force that is substantially higher than is producible with said layer being made of an ideal dielectric.

21. The electrostatic chuck of claim 20 wherein said porous dielectric material is a plasma-sprayed material.

22. The electrostatic chuck of claim 20 wherein said porous dielectric material is formed by anodization.

* * * * *